United States Patent [19]

MacRae et al.

[11] 3,767,492

[45] Oct. 23, 1973

[54] SEMICONDUCTOR MASKING

[75] Inventors: Alfred Urquhart MacRae, Berkeley Heights; Robert Alan Moline, Gillette, both of N.J.

[73] Assignee: Bell Telephone Laboratories, Incorporated, Murray Hill, Berkeley Heights, N.J.

[22] Filed: Oct. 12, 1971

[21] Appl. No.: 188,175

[52] U.S. Cl. .......................... 156/11, 156/17, 156/2, 204/192

[51] Int. Cl. .............................................. H01l 7/00

[58] Field of Search ................. 156/17, 11; 204/192

[56] References Cited

UNITED STATES PATENTS 3,474,021 10/1969 Davidse et al. .................... 204/192

*Primary Examiner*—Jacob H. Steinberg

*Attorney*—W. L. Keefauver et al.

[57] ABSTRACT

The specification describes a masking technique for semiconductor processing in which the usual photolithographic mask is eliminated by the use of an ion beam resist technique. The ion beam exposure is performed through a shadow mask. The mask layer comprises a dual dielectric. Preferential etching of the exposed portions of the top layer is used initially to form the pattern and the patterned top layer is used as a mask for the underlayer. This is advantageous when the preferential etch ratio between the composite materials substantially exceeds the available etch ratio between the beam-exposed material and the unexposed material.

The use of $SiO_2$-$Si_3N_4$ and $SiO_2$-$Al_2O_3$ composites are suggested. Ion-bombarded $Si_3N_4$ has been found to be susceptible to etching in HF so that a single etchant can be used for both layers of the $SiO_2$-$Si_3N_4$ composite.

5 Claims, 1 Drawing Figure

SEMICONDUCTOR MASKING

This invention relates to selected area etch processes for semiconductors.

BACKGROUND OF THE INVENTION

Semiconductor processing relies heavily on the well-known and highly developed photolithographic technology. Although available techniques can achieve most of the current processing objectives, simpler masking techniques are continuously sought to reduce the expense of the masking process. Specifically, it would be desirable to eliminate the wet chemistry associated with forming the mask.

This objective can be realized through the use of an ion beam resist if the ion beam exposure is made through a shadow mask. It is known, for example, that if silicon dioxide is exposed to an ion beam, it becomes more soluble in standard chemical etches. Accordingly, if an $SiO_2$ layer is selectively exposed to the ion beam through a shadow mask, the layer can be etched, without masking, to form the pattern. However, if the etch ratio of exposed to unexposed material is low, then the unexposed regions undergo considerable etching before the pattern is completed. Not only does this etching consume the desired layer, but it may also convert otherwise tolerable pinholes and nonuniformities into gross defects. The etch ratio of exposed $SiO_2$ to unexposed $SiO_2$ where, for example, the exposure is 150 keV B+ ions at a dose of $10^{15}$ $cm^{-2}$ is of the order of 2. This may not be sufficient to avoid the problems alluded to above.

These deficiencies can be overcome at least in part through the use of this invention in which the ion beam resist technique is used to form a preselected pattern in a masking layer overlying an $SiO_2$ layer. The masking layer is typically an insulating layer that possesses two essential properties. First, it must be susceptible to enhanced etching when exposed to an appropriate ion beam. Second, the unexposed material must be relatively insoluble to an etchant that effectively attacks $SiO_2$. Both of these properties are exhibited by $Si_3N_4$ and $Al_2O_3$ and these materials form the basis for preferred species of the invention.

The use of the ion beam resist technique to form the pattern in the first layer of a dual dielectric mask has at least two added virtues. The layer of the composite mask involved in the ion beam resist process may be very thin. Therefore, the ion beam exposure and the etch process require only minimum conditions, and the resulting resolution is high. However, it should be pointed out that the thickness of the resist portion of this layer must exceed a minimum thickness which is the thickness of the $SiO_2$ masking layer multiplied by the $Si_3N_4$ ($Al_2O_3$)/$SiO_2$ etch ratio. In addition, the layer must initially be even thicker by a factor at least equivalent to the preferential etch ratio of damaged to undamaged material.

Another advantage of the ion beam resist technique is that the etch characteristics of $Si_3N_4$ can be enhanced sufficiently by exposure to an ion beam that it becomes susceptible to etching by etchants, such as HF, that are normally effective for $SiO_2$ but ineffective for $Si_3N_4$. This means that both layers of the dual dielectric mask can be etched with the same etchant. This leads to significant processing simplifications especially in manufacturing devices that are normally made with dual dielectric passivating layers.

DETAILED DESCRIPTION

Figure 1:
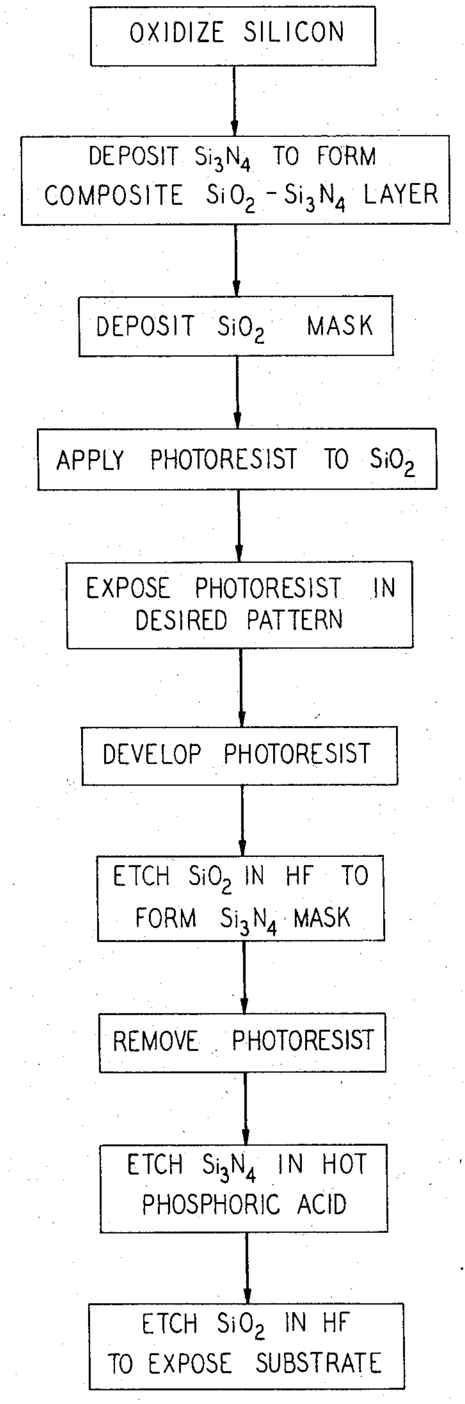
FIG. 1 (PRIOR ART)
Figure 2:
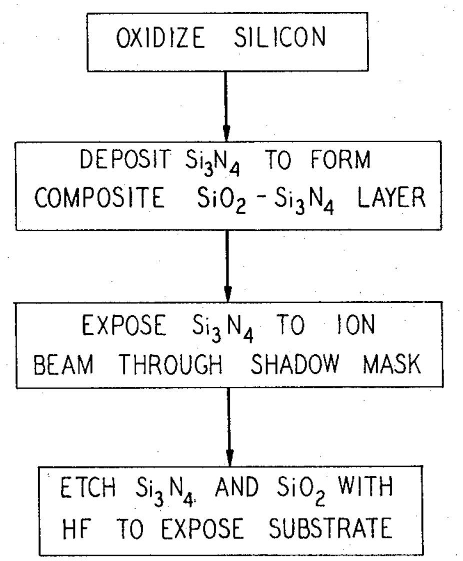

These and other aspects of the invention will become more evident from the following detailed description. In the drawing:

FIG. 1 is a flow diagram of the typical prior art processing sequence to etch patterns in dual dielectric layers of, for example, $SiO_2$ and $Si_3N_4$; and FIG. 2 is a flow diagram similar to that of FIG. 1, illustrating a typical processing simplification obtainable through the use of this invention.

Referring to FIG. 1, the steps conventionally used to form windows in a dual $SiO_2$-$Si_3N_4$ layer involve forming the two layers, depositing an $SiO_2$ masking layer on the $Si_3N_4$, defining the pattern in the mask by photolithography, etching the $SiO_2$ mask removing the photoresist, etching the nitride with hot phosphoric acid, rinsing, and etching the $SiO_2$ layer with HF. Such a sequence is suggested, for example, in U.S. Pat. No. 3,475,234, issued Oct. 28, 1969 to R. E. Kerwin-D. L. Klein and J. C. Sarace (for making field effect transistors).

The simplified processing for obtaining the same result, according to this invention, is illustrated by the sequence of steps shown in FIG. 2. The ion beam resist technique, in which the pattern is formed by exposure to an appropriate ion beam through a shadow mask, eliminates the photolithography and the wet chemistry associated with it. The use of shadow masks for selective ion beam exposure is described in U.S. patent application, Ser. No. 101,592 filed Dec. 28, 1970 by M. P. Lepselter and A. U. Mac Rae. The regions of the $Si_3N_4$ layer that are exposed to the beam exhibit enhanced etching as compared with the unexposed material. By way of specific illustration, $Si_3N_4$ exposed to 120 keV $O_2$+ molecules at a dose of $2 \times 10^{17}$ molecules/$cm^2$ etches approximately 15–20 times faster than unexposed $Si_3N_4$. It is also found to be selectively etched by HF. At the same time, however, the etch ratio in HF of unexposed $SiO_2$ to $Si_3N_4$ is still sufficiently high, of the order of 20, to allow the $Si_3N_4$ to effectively mask the underlying $SiO_2$ when the selectively exposed composite structure is etched.

Preferential etch behavior produced by ion beam exposure results from bombardment with a variety of ions, with heavier ions being more effective at lower doses. This suggests, as would be expected, that the preferential etch phenomenon is due at least in part to molecular damage, and that a large variety of ions and exposures can be selected to achieve a useful result. Thus, the invention is perhaps best described in terms of imparting sufficient ion beam exposure to the surface layer of a dual dielectric so that it becomes susceptible to preferential etching with respect to the unexposed portions of the layer.

While it is expected that the technique of this invention is most likely to find use in connection with the manufacture of devices having dual dielectric layers, it is also applicable to processing devices in which the dual dielectric is not a part of the finished device. One or both of the layers can be removed, if desired, after they have performed the appropriate masking function. This possibility suggests the use of materials other than the insulating materials already mentioned. The insulators described herein are suggested by the fact that dual dielectric layers of $SiO_2$-$Si_3N_4$ and $SiO_2$-$Al_2O_3$ are commonly used as gate insulators for field effect devices. If it represents no advantage to integrate the masking layers into the final device, then a wide variety of materials, even metals, become potential candidates for use in connection with the invention.

Various additional modifications and extensions of this invention will become apparent to those skilled in the art. All such variations and deviations which basically rely on the teachings through which this invention has advanced the art are properly considered within the spirit and scope of this invention.

We claim:

1. A method for selectively etching an $SiO_2$ layer overlying a silicon semiconductor substrate by an ion beam resist technique comprising the steps of:

depositing a second layer of a dielectric selected from the group consisting of $Al_2O_3$ and $Si_3N_4$ over the $SiO_2$ layer, exposing selected portions of the second layer to an ion beam sufficient to enhance the chemical etch rate of the exposed regions without significant removal of those portions, etching away the exposed portions of the second layer with a chemical etchant that attacks the ion beam exposed portions of the layer in preference to the unexposed portions, and etching through the $SiO_2$ layer with a chemical etchant using the second layer as a mask.

2. The method of claim 1 in which the same chemical etchant is used for etching both layers.

3. The method of claim 1 in which selected portions of the second layer are exposed to the ion beam through a shadow mask.

4. The method of claim 1 in which the ion beam is 120 keV $O_2^+$ at a dose of at least $2 \times 10^{17}/cm^2$.

5. The method of claim 2 in which the etchant comprises HF.

* * * * *